United States Patent [19]
Holmberg et al.

[11] Patent Number: 5,874,746
[45] Date of Patent: Feb. 23, 1999

[54] TFT, METHOD OF MAKING AND MATRIX DISPLAYS INCORPORATING THE TFT

[75] Inventors: Scott H. Holmberg, Pleasanton; Ronald L. Huff, San Ramon, both of Calif.

[73] Assignee: Hyundai Electronics America, Inc., San Jose, Calif.

[21] Appl. No.: 13,798

[22] Filed: Jan. 26, 1998

Related U.S. Application Data

[63] Continuation of Ser. No. 497,371, Jul. 31, 1995, Pat. No. 5,737,041.

[51] Int. Cl.$^6$ .......................... H01L 27/01; H01L 27/12; H01L 31/0392
[52] U.S. Cl. .................. 257/59; 257/72; 257/350; 257/390; 257/401
[58] Field of Search ................. 257/59, 72, 350, 257/390, 401

[56] References Cited

U.S. PATENT DOCUMENTS

| | | | |
|---|---|---|---|
| 4,902,638 | 2/1990 | Muto | 437/51 |
| 5,062,690 | 11/1991 | Whetten | 359/59 |
| 5,394,258 | 2/1995 | Morin et al. | 359/59 |
| 5,652,633 | 7/1997 | Lee | 349/42 |

*Primary Examiner*—Ngân V. Ngô
*Attorney, Agent, or Firm*—Townsend and Townsend and Crew LLP

[57] ABSTRACT

Improved thin film transistors to reduce defects in the devices incorporating the transistors, including active matrix displays. A first improvement is accomplished by forming a dual insulator layer over the bottom metal layer, which can be the gate line and also the row line in an active matrix display. The first insulator layer is formed by anodizing the metal layer and the second insulator layer is deposited onto the first layer. The dual insulator structure layer can be reanodized to eliminate the effect of pinholes. A second improvement includes providing an interdigitated transistor structure to increase the channel width, minimize internal shorting and minimize the drain capacitance. The interdigitated structure includes at least one source or drain finger formed between at least two drain or source fingers, respectively. A shorted source finger can be disconnected to maintain an operative transistor. A further improvement is provided when forming an active matrix display storage capacitor utilizing the dual insulator layer. A redundant column line can be formed utilizing a second overlying metal layer. A defect masking transistor also can be coupled from each pixel to the previous gate or row line.

15 Claims, 12 Drawing Sheets

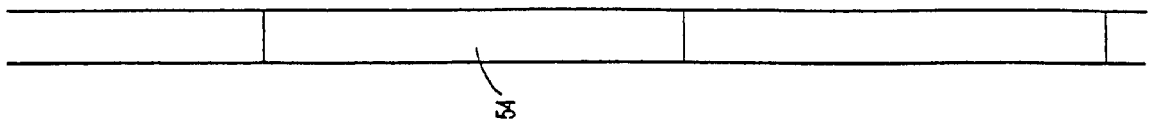
FIG. 4

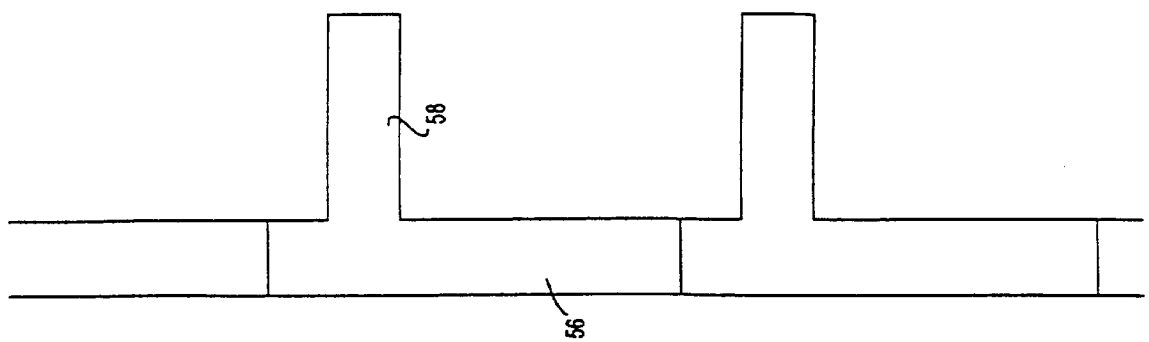
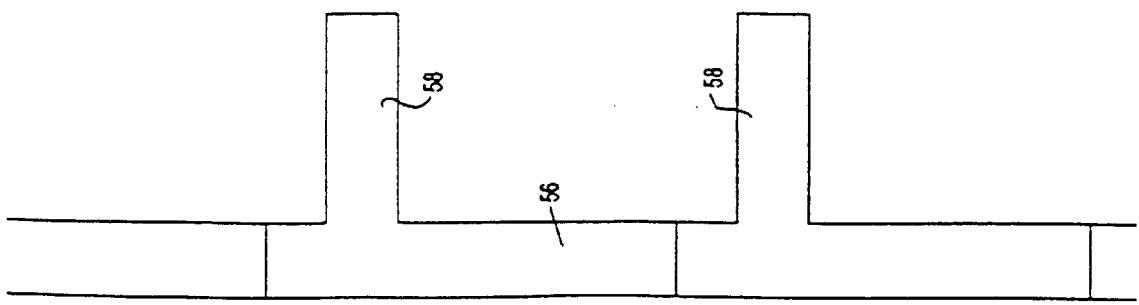
FIG. 5

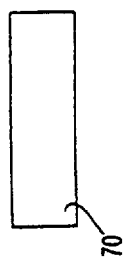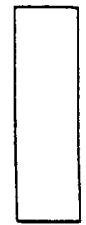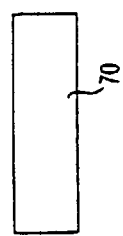
FIG. 6

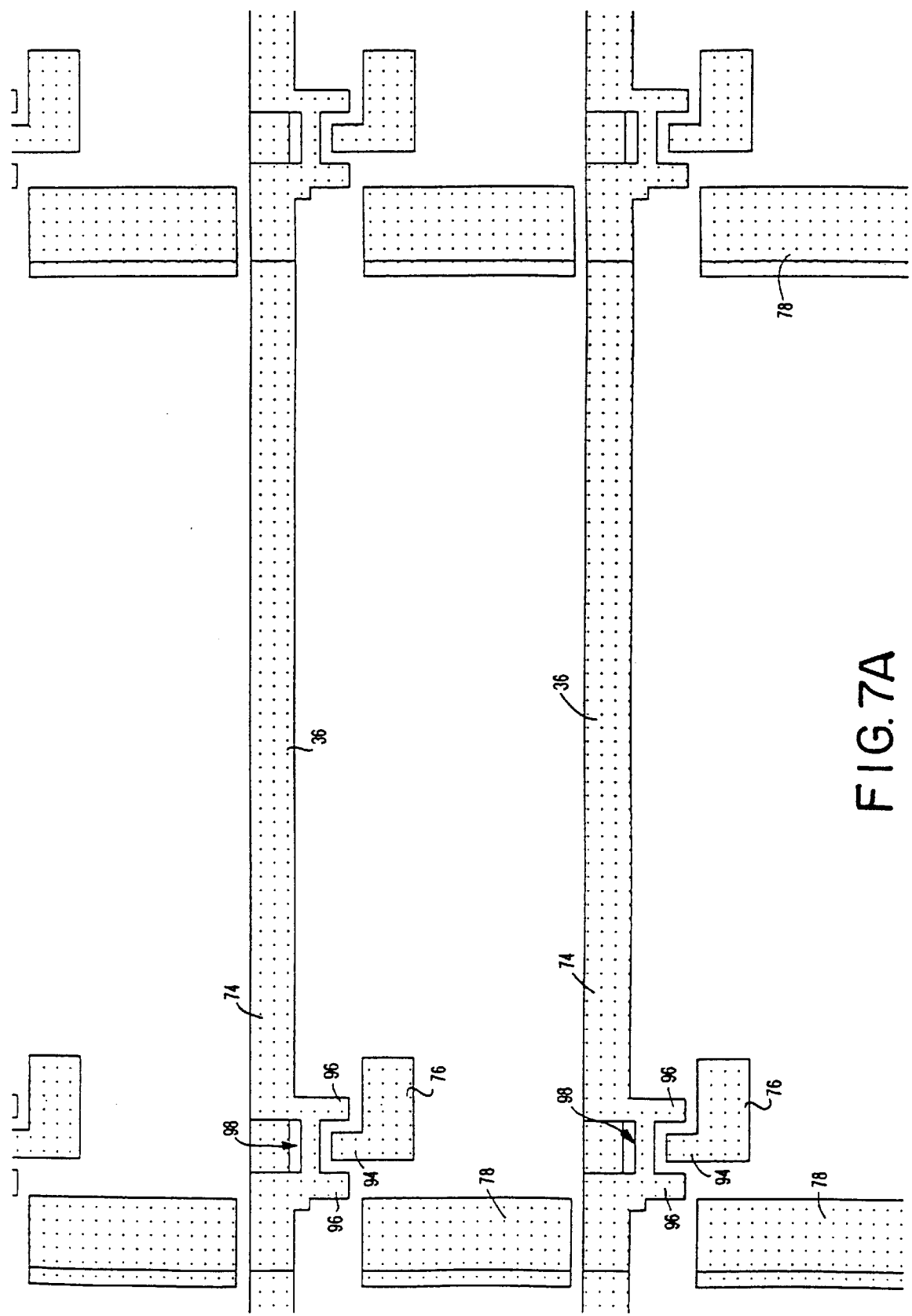

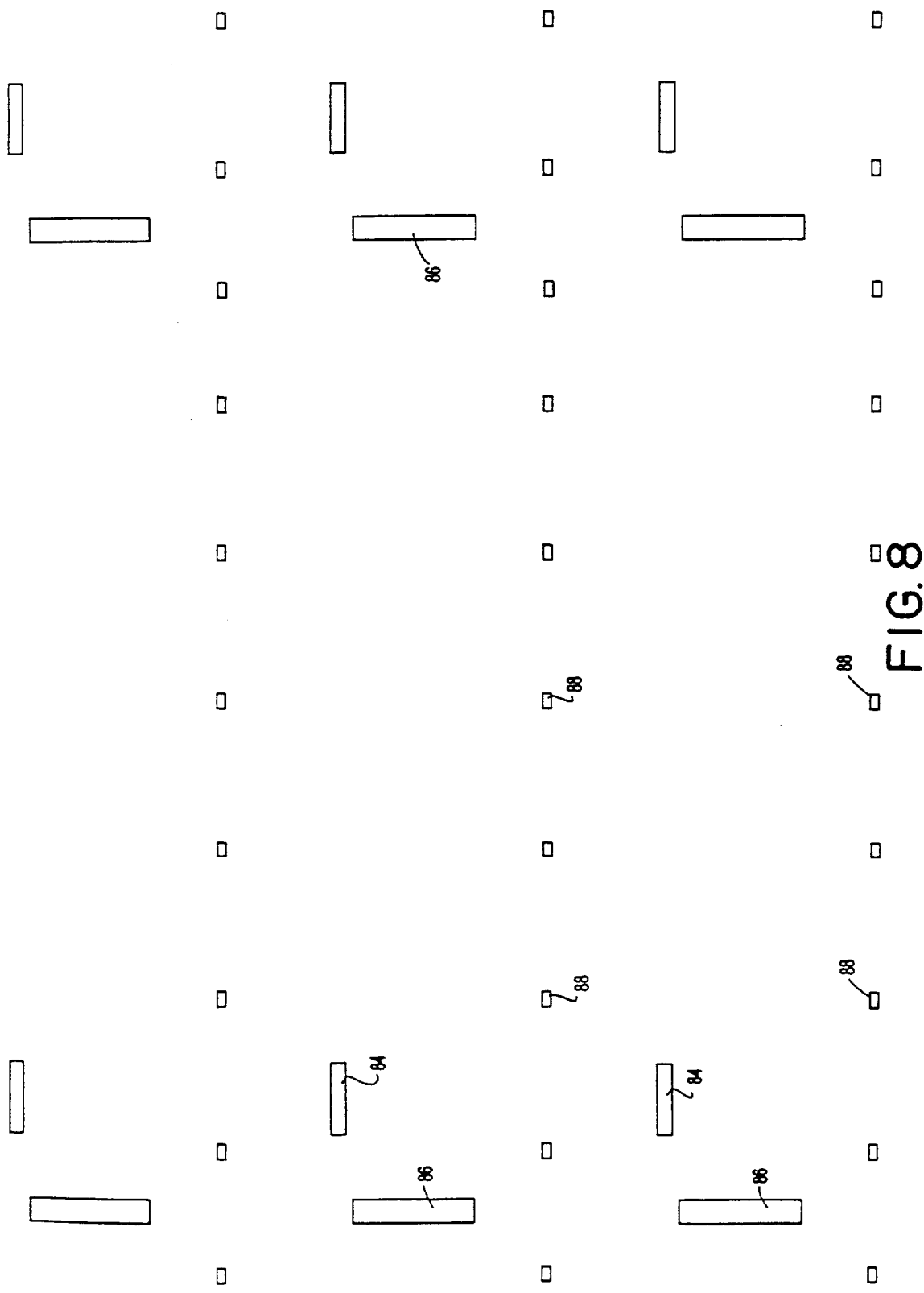

TFT, METHOD OF MAKING AND MATRIX DISPLAYS INCORPORATING THE TFT

This application is a continuation of application Ser. No. 08/497,371, filed Jul. 31, 1995, now U.S. Pat. No. 5,737,041.

BACKGROUND OF THE INVENTION

The present invention pertains to an improved thin film transistor, method of making the thin film transistor and displays incorporating the transistor. More particularly, the present invention is directed to a method of making thin film transistors to increase the yield of the finished transistors and devices made therefrom.

In recent years there has been growing interest in thin film transistors and devices incorporating such thin film transistors, such as memory arrays, all types of integrated circuits and replacements for mechanical switches and relays. For example, reed relays can fatigue and MOS switches exhibit too much leakage current.

A specific exemplary use of the thin film transistor is in flat panel displays, such as those which employ liquid crystals, field emission, plasma, electrochromic or electroluminescense, as replacements for conventional cathode ray tubes (CRT). The flat panel displays promise lighter weight, less bulk and substantially lower power consumption than CRT's. Also, as consequence of their mode of operation, CRT's nearly always suffer from some distortion. The CRT functions by projecting an electron beam onto a phosphor-coated screen. The beam will cause the spot on which it is focused to glow with an intensity proportional to the intensity of the beam. The display is created by the constantly moving beam causing different spots on the screen to glow with different intensities. Because the electron beam travels a further distance from its stationary source to the edge of the screen that it does to the middle, the beam strikes various points on the screen at different angles with resulting variation in spot size and shape (i.e. distortion).

Flat panel displays are inherently free of such distortion, because each pixel is photolithographically patterned on the substrate as opposed to being defined by where the CRT electron beam strikes the phosphor on the screen. In the manufacture of the flat panel displays the circuit elements are deposited and patterned, generally by photolithography, on a substrate, such as glass. The elements are deposited and etched in stages to build a device having a matrix of perpendicular rows and columns of circuit control lines with a pixel contact and control element between the control line rows and columns. The pixel contact has a medium thereon which is a substance that either glows (emissive) or modulates the transmission of ambient light (nonemissive) when a threshold voltage is applied across the medium control element. The medium can be a liquid crystal, electroluminescent or electrochromic materials such as zinc sulfide, a gas plasma of, for example, neon and argon, a dichroic dye, or such other appropriate material or device as will luminesce or otherwise change optical properties in response to the application of voltage thereto. Light is generated or other optical changes occur in the medium in response to the proper voltage applied thereto. The optically active medium on each contact is generally referred to as a picture element or "pixel".

The circuitry for a flat panel display is generally designed such that data is generally shifted in on all the column lines each to a predetermined voltage. One row is then energized to turn on all the transistors in that row (one row is written at a time). That row is then shut off and the data for the next row is shifted into all the column lines and then the second row is energized and written. This process is repeated until all the rows have been addressed. All the rows are generally written in one frame period, typically about 1/60th of a second or about 16.7 ms. Then voltages representing the data are supplied selectively to particular columns to cause selected pixels to light up or change optical properties as the row is written. The pixels can be made to change intensity by applying a large voltage or current or a longer pulse of voltage or current. Utilizing liquid crystal display (LCD's) with twisted nematic active material, the display is substantially transparent when not activated and becomes light absorbing when activated or vice versa depending upon polarizer orientation. Thus, the image is created on the display by sequentially activating the pixels, row by row across the display. The geometric distortion described above with respect to CRT's is not a factor in flat panel displays since each pixel location is photolithographically determined and fixed.

One of the major problems that arises with respect to the prior art method of manufacturing structures for active matrix displays (e.g. those employing thin film transistors at each pixel) is that they generally suffer production yield problems similar to those of integrated circuits. That is, the yields of devices produced are generally not 100% and the yield (percentage of devices with no defects) can be 0% in a worst case. High quality displays will tolerate very few defective transistors or other components. Also, larger size displays are generally more desirable than smaller size displays. Thus, a manufacturer is faced with the dilemma of preferring to manufacture larger size and/or higher resolution displays, but having to discard the entire product if more than a few transistors and hence if more than a few pixels are defective. In other words, the manufacturer suffers a radically increased manufacturing cost per unit resulting from decreasing usable product yield.

These problems of increased cost and decreased yield are dramatically improved in the present invention by providing a method of manufacturing transistors with a greatly reduced number of defects which can be utilized in all types of integrated circuits, such as active matrix displays.

SUMMARY OF THE INVENTION

There is provided improved methods of making thin film transistors to reduce defects in the devices incorporating the transistors, including active matrix displays. A first improvement is accomplished by forming a dual insulator layer over the bottom metal layer, which can be the gate line and also the row line in an active matrix display. The first insulator layer is formed by anodizing the metal layer and the second insulator layer is deposited onto the first layer. The dual insulator structure can be reanodized to eliminate the effect of pinholes in the layers. A second improvement includes providing an interdigitated transistor structure to increase the channel width, minimize internal shorting and minimize the drain capacitance. The interdigitated structure includes at least one source or drain finger formed between at least two drain or source fingers, respectively. A shorted source finger can be disconnected to maintain an operative transistor. A further improvement is provided when forming an active matrix display storage capacitor utilizing the dual insulator layer. A redundant column line can be formed utilizing a second overlying metal layer. A defect masking transistor also can be coupled between each pixel and the previous gate or row line.

BRIEF DESCRIPTION OF THE DRAWINGS

FIGS. 4–10 are partial plan views of the transistor and display manufacturing steps.

DESCRIPTION OF THE PREFERRED EMBODIMENTS

Figure 1:
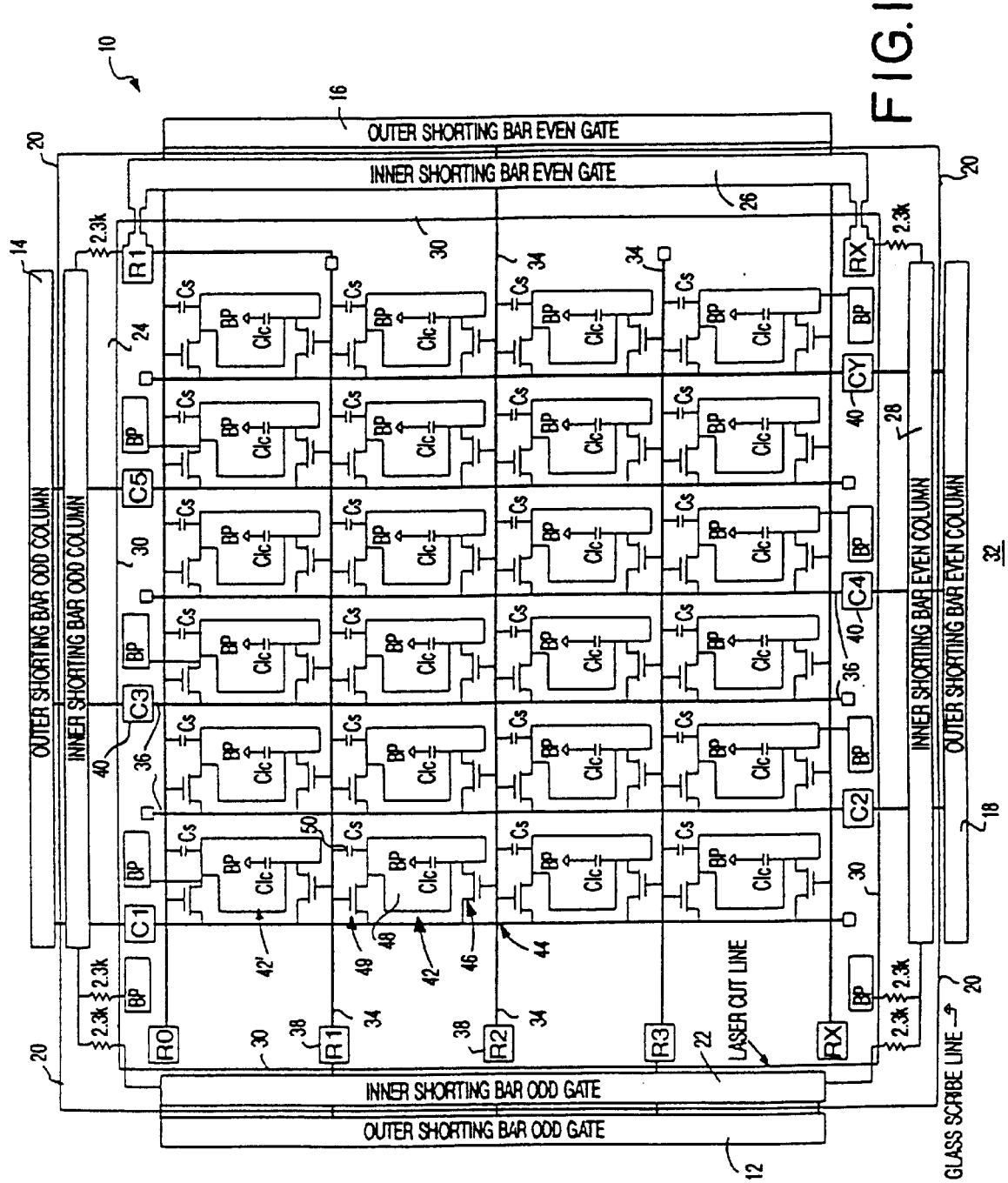
FIG. 1 is a plan view schematic representation of an active matrix display incorporating the transistor of the present invention.

As before mentioned, numerous devices can be formed utilizing thin film transistors (TFT's), one particular utilization is in active matrix liquid crystal displays (AMLCD's) and the TFT of the present invention will be described as a portion of an AMLCD. Referring to FIG. 1, a schematic representation of an AMLCD of the present invention is designated generally by the reference numeral 10.

The AMLCD 10 is illustrated including a set of optional outer shorting bars 12, 14, 16 and 18, which are more fully described in copending application Case 08/782,335, entitled ACTIVE MATRIX ESD PROTECTION AND TESTING SCHEME, filed on Jan. 13, 1997 and incorporated herein by reference. The outer shorting bars 12, 14, 16 and 18 are removed during processing by disconnecting or breaking them away along a scribe line 20, as more fully described in Case 08/782,335.

The AMLCD 10 also is illustrated including a set of inner shorter bars 22, 24, 26 and 28. The inner shorting bars 22, 24, 26, and 28 also are utilized during processing, as more fully described in Case 08/782,335. However, the inner shorting bars 22, 24, 26 and 28 only are electronically disconnected from the AMLCD 10 along a line 30 such as by a laser, but remain a physical part of the AMLCD 10.

The AMLCD 10 is deposited on a substrate 32, commonly formed from a glass panel, which is broken away along the scribe line 20 as above described. The substrate 32 also can be formed from other types of insulating materials, including for non-light transmissive applications a metallic panel with an insulative coating. The AMLCD 10 is formed with a plurality of row lines 34 and a plurality of column lines 36 forming a large matrix, only a small portion of which is illustrated. The row lines 34 include one of a plurality of driver contact pads 38 connected to each line 34 and the column lines 36 also include one of a plurality of driver contact pads 40 connected to each line 36.

The AMLCD 10 includes a plurality of identical pixels formed between the row lines 34 and the column lines 36, therefore only one pixel 42 will be described in detail. At each matrix crossover point 44, where a row line 34 and a column line 36 cross, a TFT 46 is formed to connect both lines to a pixel contact 48. The active liquid crystal medium is formed at least over the contact 48, which medium will change properties in response to the backplane and data voltages applied to the pixel 42. The medium on the pixel 42 will appear generally as a square, rectangle or dot in the overall matrix of the AMLCD 10. The actual size of the transistor 46 and the contact 48 are not drawn to scale, but are shown schematically for illustration only.

It should be noted that there is no theoretical limit on the number of row lines 34 and column lines 36 that can be employed or on the outside dimension of an AMLCD 10. The processing equipment provides a practical limit on the outside dimension, which limit is continually changing as the equipment is improved.

The problem encountered with manufacturing AMLCD's is that if the AMLCD 10 contains defective TFT's or other circuit elements causing more than a few pixels to be inoperative, the display generally must be discarded. One technique of masking defective pixels 42, is to employ an additional (optional) transistor 49 with the pixel 42 coupling the pixel 42 to an adjacent row R1. Then, when row R1 is written the data is applied not only to the previous pixel 42', but also through the transistor 49 into the pixel 42. When row R2 then is written the data for the pixel 42 is written over the data from the previous pixel through the transistor 46. If, however, the transistor 46 is defective, the pixel 42 will not show as inoperative, but instead will retain the data from the previous row R1. This masks the fact that the pixel 42 is not operating correctly.

Figure 11:
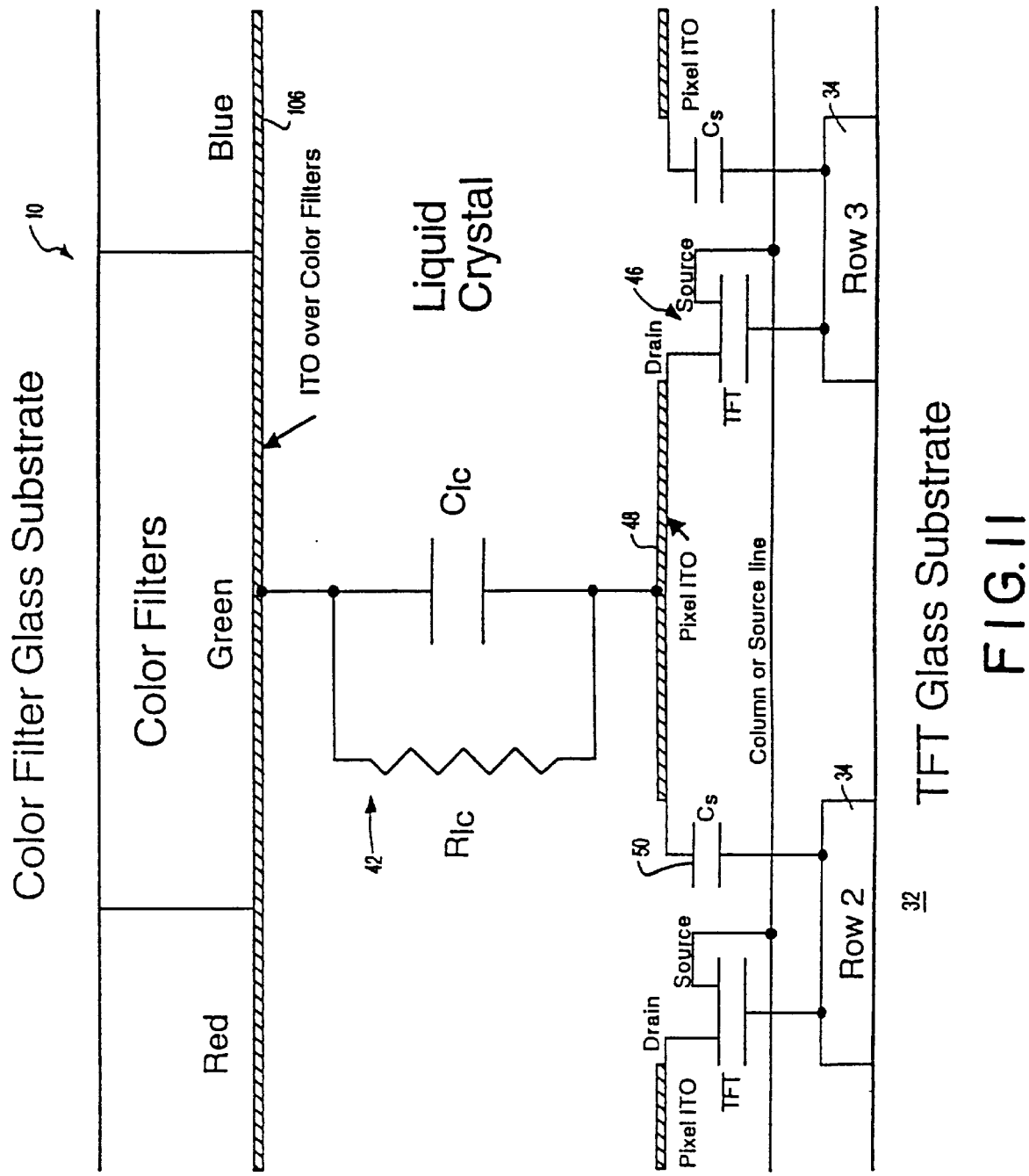
FIG. 11 is a partial diagramatic view of the completed display.

As further described in FIG. 11, the pixel 42 also can include a storage capacitor 50 coupled to the row R1 which maintains and stabilizes the voltage written into the pixel 42 during each frame.

Figure 2:
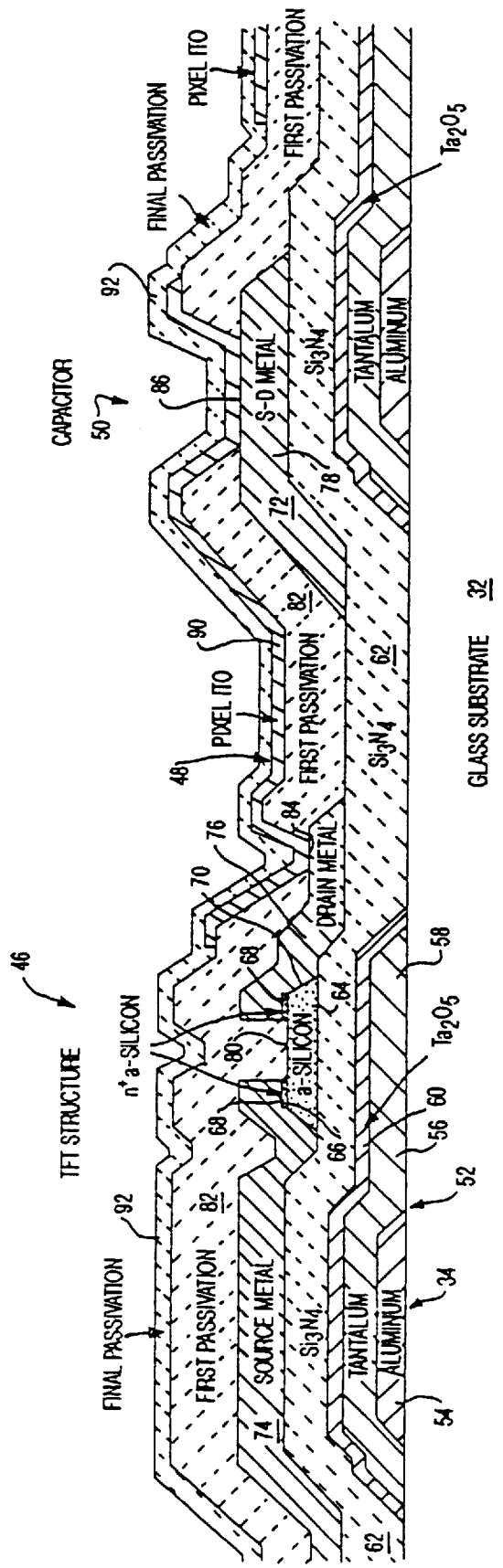
FIG. 2 is a staggered cross-section of one embodiment of a transistor and a storage capacitor of the present invention.
Figure 3:
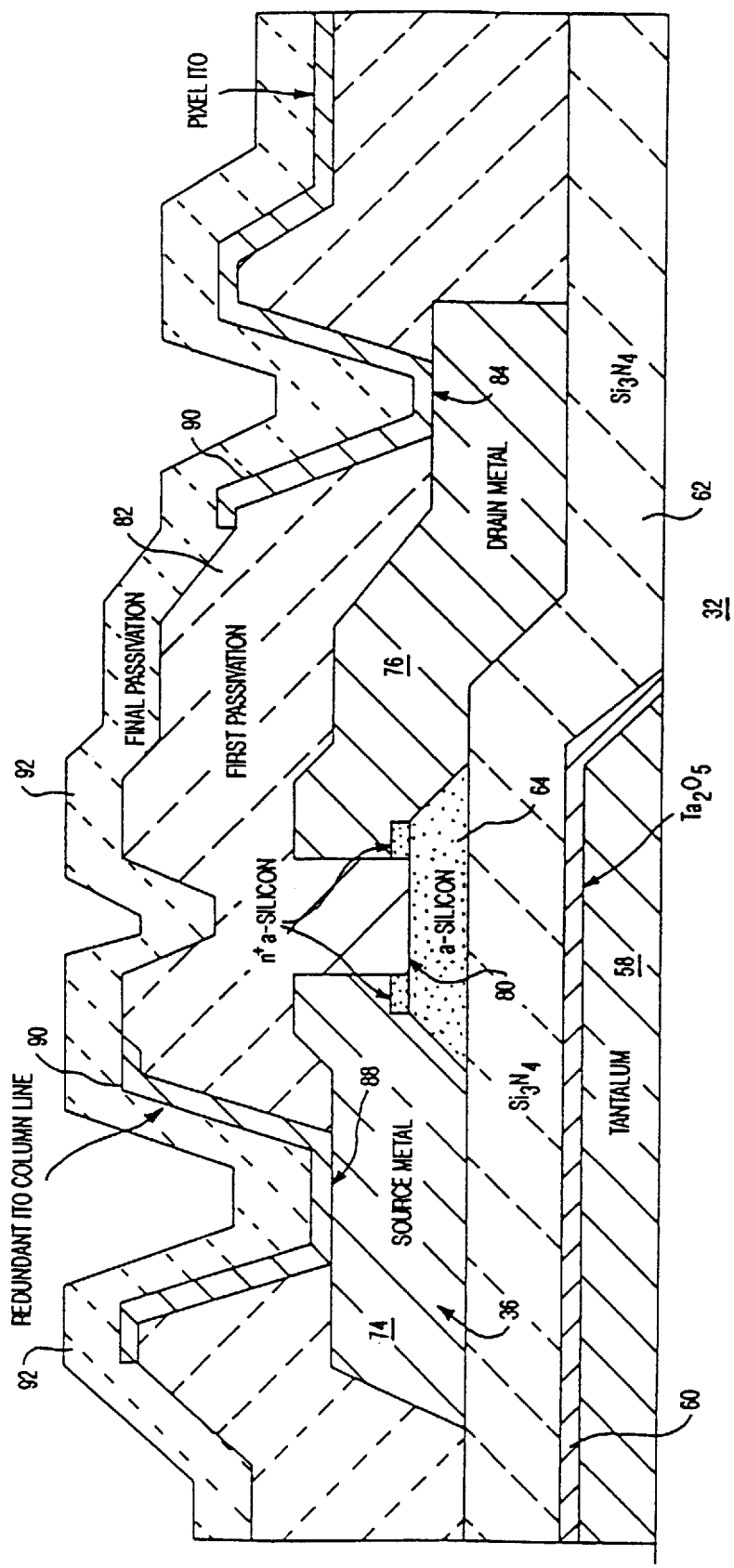
FIG. 3 is a second cross-section of the transistor embodiment of FIG. 2.

The TFT 46 and the AMLCD 10 of the present invention are formed to enhance the yield of active pixels. The TFT 46 will be described with reference to FIG. 2. The TFT 46 is formed with a gate 52 being deposited first as the row line 34. The completed TFT 46 is illustrated in FIGS. 2 and 3, while the various process steps are best illustrated in FIGS. 4–10. Although the various layer thicknesses are not critical to the invention, preferable thicknesses and materials are described to form a preferred embodiment of the TFT 46 and the AMLCD 10.

The gate 52 preferably is formed of two layers of metal. A first layer of aluminum, preferably an aluminum alloy, is deposited and patterned to form a line element 54 (see FIG. 4). To form a redundant row line 34, a second gate layer of tantalum is deposited over the aluminum element 54 and patterned to form a line element 56 (see FIG. 5) which covers the element 54. The element 56 also has fingers 58 (FIG. 5) which form the actual gates for the individual TFT's 46. The line element 54 preferably is formed from aluminum or an aluminum alloy. Aluminum is utilized for long lines because of its high conductivity, but is not critical for small displays and can be eliminated from small displays if desired. The aluminum is deposited to about 1200 Angstroms to provide conductivity, but still be thin enough to prevent step coverage problems over the element 54. The tantalum element 56 or other anodic refractory metal preferably is deposited separately for redundancy to about 2000 Angstroms. The fingers 58 which form the gates for the TFT 46 do not require the aluminum layer and typically are formed only of tantalum.

A first gate insulator layer 60 is then formed by anodizing the exposed tantalum element 56, which is hard anodized to form the insulator layer 60 from tantalum oxide, $Ta_2O_5$. A hard anodization can be performed by utilizing a solution of about 0.1 to 4.0 percent citric acid in deionized water. A voltage of about sixty (60) volts can be utilized which will form a very precise and uniform oxide layer 60 to about fifteen (15) Angstroms per volt or about a thickness of 900 Angstroms. The pads 38 and 40 can be covered with photoresist to prevent anodization of the pads or can be anodized and then later etched.

Alternatively, the first gate insulator 60 can be formed by a deposited dielectric layer. A second or redundant gate insulator 62 then is deposited, preferably silicon nitride, Si₃N₄, to a thickness of about 3000 Angstroms. Two additional layers sequentially are deposited, a layer of amorphous silicon 64 and then a layer of N+ doped amorphous silicon 66. The N+ layer 66 and amorphous silicon layer 64 selectively are etched to leave discrete areas 70 (FIG. 6) over the gate portions 58 on the nitride layer 62. The amorphous silicon layer 64 is deposited to a thickness of about 1500 Angstroms and the N+ layer 66 is deposited to a thickness of about 300 Angstroms. After patterning the remaining N+ layer forms ohmic contact portions 68.

A reanodization can be performed before the next metal layer is deposited to prevent potential shorts, especially at any point that the drain or source metal overlies the gate metal. The reanodization is performed at a voltage at least twice the maximum voltage normally present between the source and gate lines. The reanodization will form a new oxide in the tantalum or underlying aluminum layer to prevent a later deposited metal from shorting to the gate line through a pinhole which exposed the gate metal.

A source-drain (S-D) layer 72 then is deposited, preferably formed from a plurality of metal layers for large displays. For small displays, the layer 72 can be a single metal layer, such as aluminum or molybdenum. A preferable large device multilayer 72 is formed by depositing a first barrier layer of molybdenum to a thickness on the order of 500 Angstroms. A second conductivity enhancing layer of aluminum or aluminum alloy then is deposited to a thickness of about 5000 Angstroms. A third barrier layer of molybdenum or molybdenum alloy then is deposited to a thickness of about 300 Angstroms. Alternatively, only the first two layers are required to be deposited.

The S-D layer 72 then is patterned to form a source portion 74, a drain portion 76 and a top capacitor contact portion 78. A transistor channel region 80 then is formed between the source and drain portions 74 and 76 by removing the N+ doped layer between the contact portions 68; which remain under the S-D metal portions 74 and 76. At this point the transistor 46 is electrically functional.

The storage capacitor 50 also now is electrically functional and is formed by the contact portion 78 and the underlying portions of the nitride layer 62, the oxide layer 60 and the gate 52. Both the transistor 46 and the capacitor 50 can now be electrically tested, as desired.

A first passivation layer 82 then is deposited, preferably formed of Si₃N₄ to a thickness of about 7000 Angstroms. This dielectric layer also could be formed from deposited SiO₂, spin on glass (SOG) or other organic dielectric materials. The layer 82 is patterned to form a drain contact opening 84 and a capacitor contact opening 86. When a redundant column line is to be formed, vias 88 (FIG. 3) are formed to provide contacts to the underlying column line 36.

A pixel ITO layer 90 then is deposited and patterned to form the drain contact at the opening 84, the capacitor contact at the opening 86, the redundant column line by contacting through the vias 88 (where applicable) and the pixel 48. The pixel 48 is not shown to scale and the section is offset to include both the transistor 46 and the capacitor structure 50, which are staggered from one another. The section does not fully illustrate the electrical separation between the column ITO and the pixel ITO 48 (see FIGS. 1 and 9). The additional transistor 49 (FIG. 1) is not illustrated, but is formed in the same manner as the transistor structure 46.

The TFT structure is then completed by forming a final passivation layer 92. The passivation layer 92 is formed to a thickness of about 2000–3000 Angstroms in the same manner as the layer 82. The layer 92 could also be formed on the color filter substrate or can be formed on both.

Figure 7B:
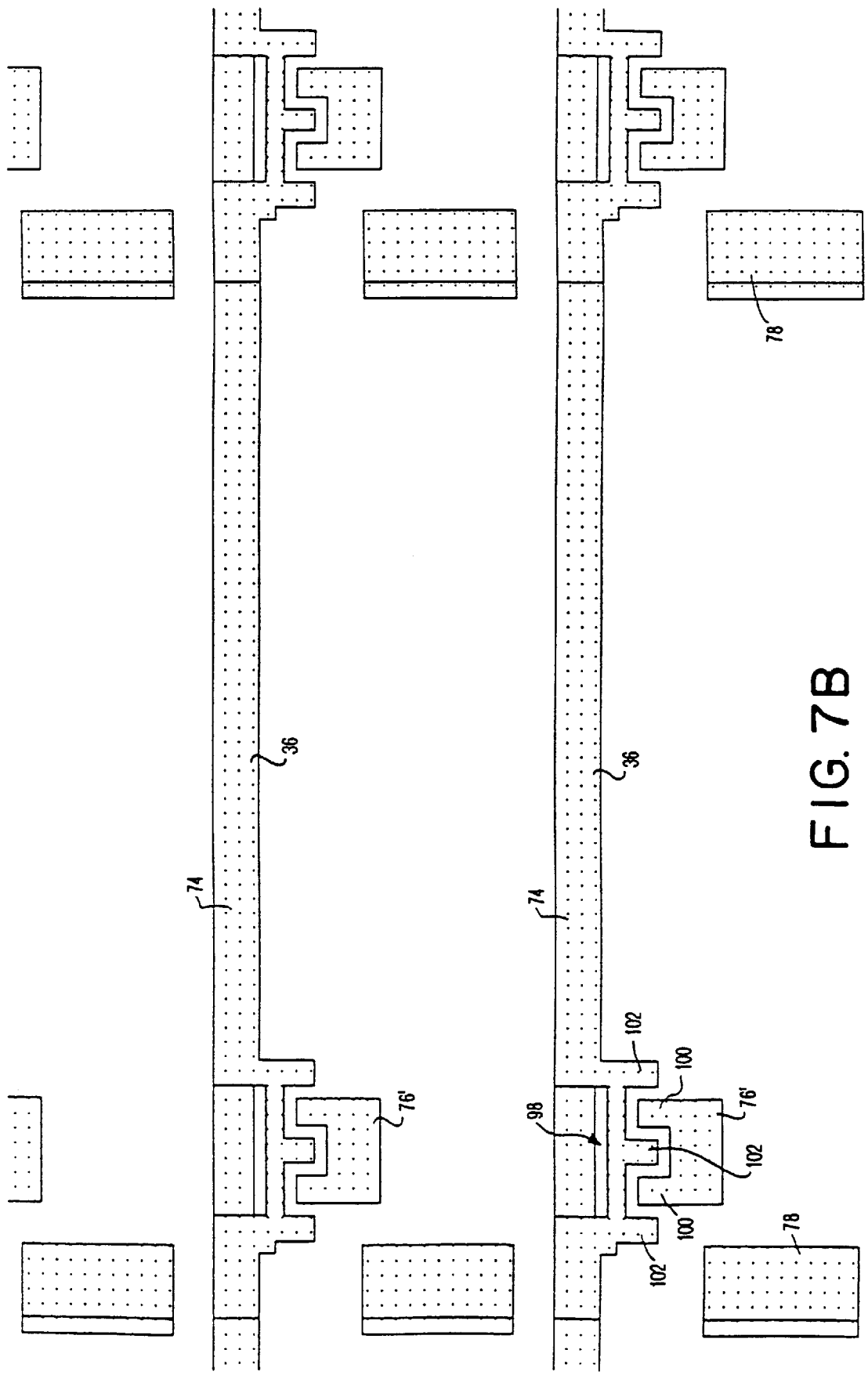

As illustrated in FIGS. 7A and 7B, the source line 74 is interdigitated with the drain 76. As illustrated in FIG. 7A, the drain 76 preferably has at lest one finger 94 and the source line 74 preferably includes a pair of fingers 96. A slot or opening 98 is etched through the source line 74 adjacent the fingers 96. The interdigitization provides several advantages. First, the channel width can be maximized, while the drain to gate capacitance is minimized. A further advantage is provided, since a short in one of the source fingers 96 can be removed during electronic testing by disconnecting the shorted finger 96. The short effectively can be removed by cutting through to the slot 98 on both sides of the shorted finger 96.

Although the drain to gate capacitance is minimized by the interdigitated embodiment illustrated in FIG. 7A, a higher drive current can be obtained by forming additional fingers as illustrated in FIG. 7B. In FIG. 7B, the drain 76 includes a pair of fingers 100 and the source 74 includes three mating fingers 102.

Figure 9:
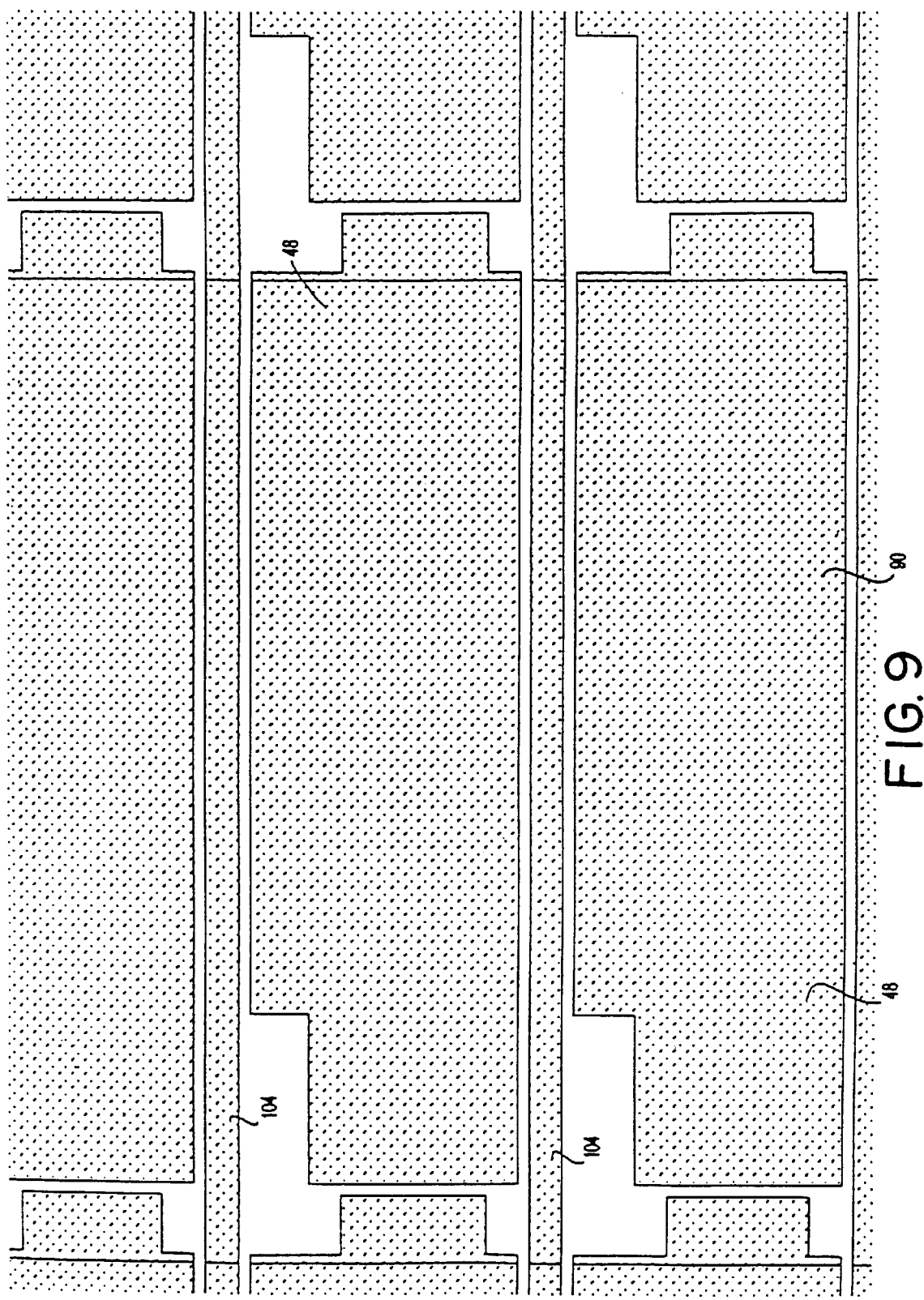

FIG. 9 illustrates the ITO layer 90, which forms the separate pixel contact 48 and a redundant column line 104. The column line 104 connects to the underlying column line 36 through the vias 88.

Figure 10:
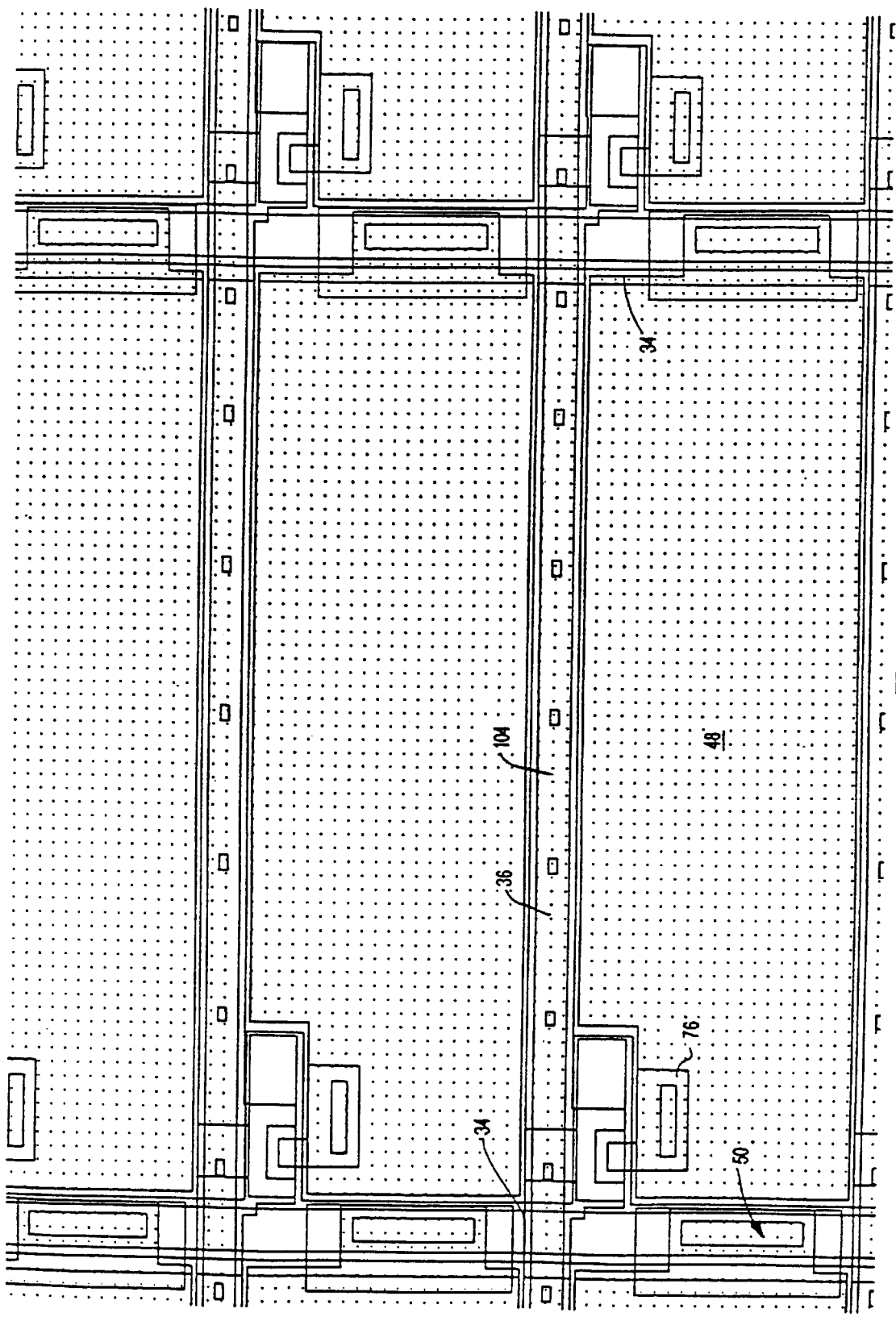

An overall composite layout of the AMLCD 10 is illustrated in FIG. 10.

FIG. 11 illustrates a portion of the completed AMLCD 10 and the reason for utilizing the storage capacitor 50. The capacitor 50 stabilizes the voltage across the liquid crystal material at a pixel 42 during the frame period when the pixel row, here row 3, is not addressed. A given pixel row is only addressed one time during a frame period, which frame is generally ¹⁄₆₀th of a second or 16.7 milliseconds. For a 480 row AMLCD 10, a given row is only addressed ¹⁄₄₈₀ of the frame period or about 34.7 microseconds. During the frame time when the pixel row is not addressed the TFT 46 is off. However, the pixel voltage should remain constant over the liquid crystal material. The liquid crystal material has a capacitance $C_{LC}$ and a finite resistance $R_{LC}$. The transistor 46 can have leakage between the driver and source and/or through the liquid crystal material resistance $R_{LC}$. To minimize the voltage drop (data decay) across the liquid crystal material the storage capacitor 50 with capacitance $C_S$ is formed in parallel with $C_{LC}$. The pixel 42 driven by the transistor 46 from Row 3 is coupled to the previous Row 2 by the capacitor 50. This assumes that Row 2 is driven just before Row 3. When the transistor 46 for a given row turns on, the transistor 46 charges $C_{LC}$ and $C_S$ since the total capacitance is equal to $C_{LC}+C_S$. The leakage currents of both the transistor 46 and the liquid crystal material are higher (worse) at higher operating temperatures. The liquid crystal material is contained between the TFT substrate 32 and a color filter or monochrome backplane 94. The backplane 94 is separated by spacers (not illustrated) from the substrate 32.

What is claimed is:

1. An improved thin film transistor, the improvement comprising
    an interdigitated source and drain formed over a gate, including at least two fingers extending from said source toward said drain spaced from one another and at least one finger on said drain extending from said drain between said two source fingers, spaced therefrom and extending partially over said gate.

2. The improvement as defined in claim 1, including at least three fingers extending from said source and at least two fingers extending from said drain, each said drain finger extending between but spaced from a pair of said source fingers and extending partially over said gate.

3. The improvement as defined in claim 1, including said source and drain formed over a redundant gate insulator, said gate insulator formed by a first anodized gate metal layer forming an insulative layer and a second insulator deposited over said anodized first insulative layer.

4. The improvement as defined in claim 1 including a gate line and a source line formed over and intersecting said gate line, a gate finger extending substantially perpendicular to said gate line and forming at least a portion of said source fingers and said drain finger formed over said gate finger.

5. The improvement as defined in claim 4 including said source fingers formed offset from said source line and overlying said gate finger.

6. An improved active matrix display, including a plurality of thin film transistors, each transistor coupling a pixel to a row or gate line and a column or source line in the display, the improvement comprising:

each transistor including an interdigitated source and drain formed over a gate including at least two fingers extending from said source toward said drain spaced from one another and at least one finger on said drain extending from said drain between said two source fingers, spaced therefrom and extending partially over said gate line.

7. The improvement as defined in claim 6, including each transistor having at least three fingers extending from said source and at least two fingers extending from said drain, each said drain finger extending between but spaced from a pair of said source fingers and extending partially over said gate line.

8. The improvement as defined in claim 6, including said source and drain of each transistor formed over a redundant gate insulator, said gate insulator formed by a first anodized gate metal layer forming an insulative layer and a second deposited insulator formed over said anodized first insulative layer.

9. The improvement as defined in claim 8, including a storage capacitor coupled between each said pixel and an adjacent row line.

10. The improvement as defined in claim 9, including said storage capacitor formed as a portion of said adjacent row line.

11. The improvement as defined in claim 8, including said storage capacitor formed from a portion of said adjacent row line including a portion of said redundant gate insulator.

12. The improvement as defined in claim 6, including an additional transistor coupling each pixel to an adjacent pixel row line.

13. The improvement as defined in claim 6, including a redundant column line formed by a second substantially transparent metal layer overlying and coupled to said column line.

14. The improvement as defined in claim 6 including a gate line and a source line formed over and intersecting said gate line, a gate finger extending substantially perpendicular to said gate line and at least a portion of said source fingers and said drain finger formed over said gate finger.

15. The improvement as defined in claim 14, including said source fingers formed offset from said source line and overlying said gate finger.

* * * * *